(12) United States Patent
Carlson et al.

(10) Patent No.: US 10,735,007 B1
(45) Date of Patent: Aug. 4, 2020

(54) METHOD OF LIMITING FREQUENCY OVERSHOOT IN A TIMING RECOVERY LOOP

(71) Applicant: Harris Global Communications, Inc., Rochester, NY (US)

(72) Inventors: Brian R. Carlson, Goode, VA (US); James McIntyre, Forest, VA (US)

(73) Assignee: HARRIS GLOBAL COMMUNICATIONS, INC., Rochester, NY (US)

( * ) Notice: Subject to any disclaimer, the term of this patent is extended or adjusted under 35 U.S.C. 154(b) by 0 days.

(21) Appl. No.: 16/423,997

(22) Filed: May 28, 2019

(51) Int. Cl.
*H03L 7/14* (2006.01)
*H03L 7/093* (2006.01)

(52) U.S. Cl.
CPC .............. *H03L 7/146* (2013.01); *H03L 7/093* (2013.01); *H03L 7/143* (2013.01)

(58) Field of Classification Search
CPC . H03L 7/14; H03L 7/143; H03L 7/146; H03L 7/148; H03L 7/093; H03L 7/085; H03L 7/10; H03L 7/08; H03L 7/06; G04R 40/02
See application file for complete search history.

(56) References Cited

U.S. PATENT DOCUMENTS

| | | | |
|---|---|---|---|
| 4,872,104 A | 10/1989 | Holsinger | |
| 5,384,526 A | 1/1995 | Bennett | |
| 5,629,649 A | 5/1997 | Ujiie | |
| 5,717,402 A | 2/1998 | Chu | |
| 5,754,607 A * | 5/1998 | Powell | H03L 7/146 375/373 |
| 6,784,706 B2 * | 8/2004 | Van Der Valk | H03L 7/093 327/147 |
| 2008/0106342 A1 | 5/2008 | Okamoto et al. | |
| 2010/0321118 A1 | 12/2010 | Smiley et al. | |
| 2012/0188125 A1 | 7/2012 | Pomietlasz | |
| 2015/0222273 A1 | 8/2015 | Allan et al. | |

* cited by examiner

*Primary Examiner* — Betsy Deppe
(74) *Attorney, Agent, or Firm* — Fox Rothschild LLP; Robert J. Sacco; Carol E. Thorstad-Forsyth

(57) ABSTRACT

Limiting frequency overshoot in a timing recovery loop involves using a proportional-integral (PI) control system to discipline a frequency of an output signal of a voltage controlled oscillator (VCO) in accordance with a time reference signal. A control signal output of the PI control system is monitored to detect conditions which will prospectively cause an excess deviation of the VCO frequency. In response to detecting such a condition, an output of an integral error term generator of the PI control system is locked or held constant. This will have the effect of preventing the excess frequency deviation of the VCO.

20 Claims, 5 Drawing Sheets

METHOD OF LIMITING FREQUENCY OVERSHOOT IN A TIMING RECOVERY LOOP

BACKGROUND

Statement of the Technical Field

The technical field of this disclosure concerns timing systems, and more particularly methods and systems for timing recovery when a reference signal has been interrupted.

Description of the Related Art

Timing systems find utility in a wide variety of application. For example, in a simulcast communication system, identical RF signals are transmitted from multiple transmit sites. Each of these signals are timed such that they simultaneously arrive in a coverage overlap region. To facilitate the signal timing required in these types of system, each of the transmit sites must have synchronized phase and frequency references. For example, a conventional simulcast communication system may use a GPS Disciplined Oscillator (GPSDO) to derive a highly accurate 1 pulse per second (1 PPS) timing signal and 10 MHz reference frequency signal. It will be appreciated by those skilled in the art that such a frequency reference/timing reference pair is proportionally related insofar as there should theoretically be exactly $10 \times 10^6$ cycles of the frequency signal during the period associated with the 1 PPS signal. The selection of 10 MHz as a frequency reference and 1 PPS as a timing reference is common but not exclusive, and other proportionally related frequency reference/timing reference pairs are also possible.

As is known, a GPSDO is comprised of a GPS receiver and a highly stable local oscillator. In such an arrangement, the local oscillator is controlled in accordance with signals broadcast by GPS or GNSS satellites. Such systems take advantage of the highly accurate atomic clocks that are included in GPS or GNSS satellites. GPSDO controls the highly stable local oscillator (e.g., a quartz or rubidium oscillator) by locking the output of the local oscillator to the received GPS signal. It accomplishes this result by using a tracking loop. The tracking loop functions to compensate for the phase and frequency changes of the local oscillator. Consequently, a GPSDO can facilitate a reference source with excellent overall stability characteristics.

SUMMARY

This document concerns a method for limiting frequency overshoot in a timing recovery loop. A proportional-integral (PI) control system is used to discipline a frequency of an output signal of a voltage controlled oscillator (VCO) in accordance with a time reference signal. A control signal output of the PI control system is monitored to detect conditions which will prospectively cause an excess deviation of the VCO frequency. Such excess deviation can occur, for example, when the VCO frequency exceeds a predetermined limit as may be set by a technical requirement or governing standard. In response to detecting such a condition, an output of an integral error term generator of the PI control system is locked or held constant. This will have the effect of preventing the excess frequency deviation of the VCO. Subsequently, the output of the integral error term generator of the PI control system can be unlocked when monitoring of the control signal output voltage reveals that the potential for excess frequency deviation has passed. The solution finds particular application in scenarios where the output signal of the VCO is a frequency reference signal and the PI loop is used to maintain coherence as between the time reference signal and the frequency reference signal.

The time reference signal described above can be provided at different times by one or more distinct time reference sources. Further, the excess deviation can be caused by transitioning from a first time reference source to a second time reference source, different from the first time reference source. For example, in some scenarios, the first time reference source is a backup time reference source, and the second time reference source is a GPS receiver that serves as a primary time reference source. Such a scenario can occur where the backup time reference source is used to discipline the VCO during a holdover mode when the GPS receiver is in a fault condition.

According to one aspect of the solution presented herein, the transition from the first to the second time reference source can be facilitated by monitoring an output of at least one of the first time reference source and the second time reference source. A preferred time reference source can then be selected as between the first and second time reference source, where the selection is based on one or more criteria associated with the monitoring. For example, these criteria can include functional availability, measured signal performance, and known quality characteristics, of the first and/or the second time reference source.

As noted above, the one or more distinct time reference sources can include a GPS receiver and one or more backup time reference sources. The backup time reference sources can include one or more of a high stability oscillator and a computer network precision time protocol (PTP). In some scenarios, the PTP can be based on a GPS signal received by a second GPS receiver.

The solution also comprises a timing and frequency reference system (TFRS) which is designed to minimize frequency overshoot during timing recovery. The TFRS includes a voltage controlled oscillator (VCO) and a proportional-integral (PI) control system loop. The PI control system is configured to generate a control signal. This control signal is used to discipline a frequency of an output signal of the VCO in accordance with a time reference signal. In some scenarios, the output signal of the VCO is used as a frequency reference signal, and the PI control system is configured to maintain coherence as between the time reference signal and the frequency reference signal. The TFRS also includes a frequency offset limiter. The frequency offset limiter is responsive to the control signal and is configured to lock an output of an integral error term generator of the PI control system under certain conditions. In particular, the frequency offset limiter is responsive to detecting a condition of the control signal that will result in an excess deviation of the frequency from a set frequency which exceeds a predetermined limit. The frequency offset limiter is also configured to unlock the output of the integral error term generator of the PI control system when the excess deviation is no longer detected.

The TFRS can also include a reference validation and selection circuit (RVSC). The RVSC can comprise a switching network or multiplexer that is configured to select an output of one time reference source from among a plurality of time reference sources for use as the time reference signal. For example, it may be necessary or advantageous to do so when a particular reference source is deemed more suitable for reasons of functional availability, measured signal performance, and/or known quality characteristics. In some scenarios, the RVSC can be configured to select the backup time reference source during a holdover mode when the GPS receiver is in a fault condition.

The excess frequency deviation of the VCO as described above can be triggered by various conditions. One example of such a condition is when the RVSC transitions from a first time reference source (e.g., a backup time reference) to a second time reference source (e.g., a primary or GPS-based time reference).

To facilitate the various functions described herein, the RVSC is advantageously configured to monitor an output of at one or more of the time reference sources. For example, the RVSC can be configured to monitor the first time reference source and the second time reference source and then make a selection of a preferred one of the time reference sources. This decision can be based on one or more criteria associated with the monitoring such as functional availability, measured signal performance, and known quality characteristics of the one or more time reference sources.

The time reference sources which provide the timing reference signal can include a primary time reference source such as a GPS receiver. The time reference source can also include at least one backup time reference source which is capable of serving as a time reference during period when a primary time reference source is experiencing a fault condition. Examples of such backup time reference sources can include a high stability oscillator (such as a rubidium or quartz oscillator) and/or a time reference system that utilizes a computer network precision time protocol (PTP) to propagate a precision time reference signal (e.g., a 1 PPS signal from a GPS receiver) in a network.

BRIEF DESCRIPTION OF THE DRAWINGS

This disclosure is facilitated by reference to the following drawing figures, in which like numerals represent like items throughout the figures, and in which.

DETAILED DESCRIPTION

Figure 1:
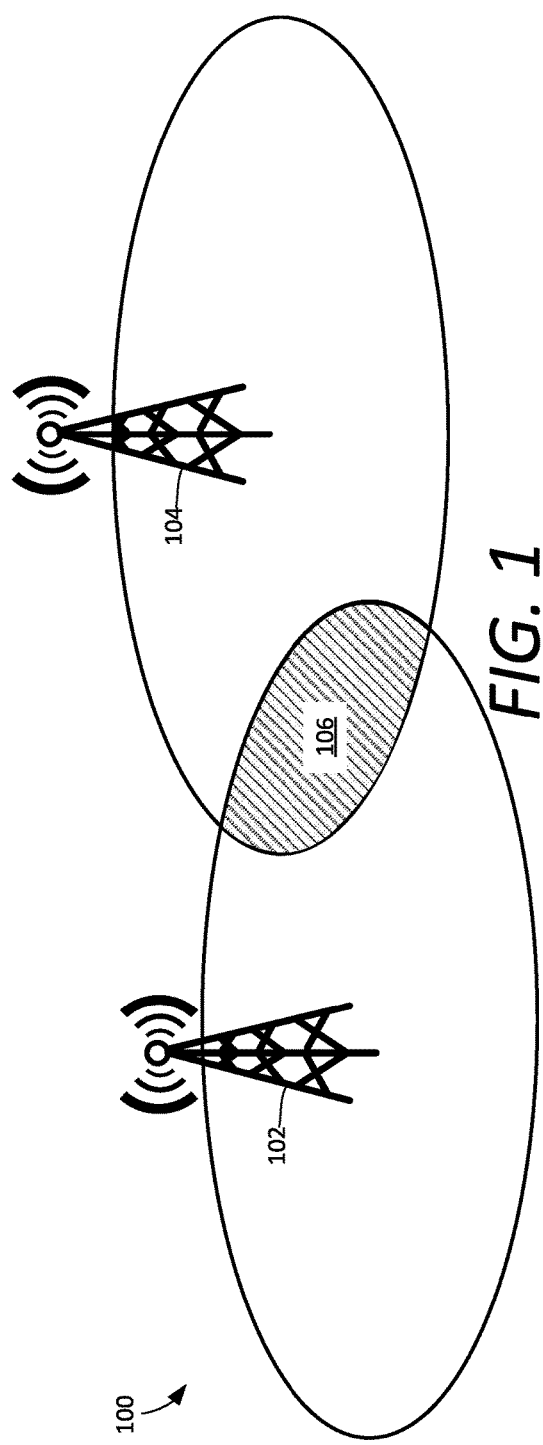
FIG. 1 is a conceptual drawing that is useful for understanding the concept of a coverage overlap region in a simulcast communication system.

It will be readily understood that the solution described herein and illustrated in the appended figures could involve a wide variety of different configurations. Thus, the following more detailed description, as represented in the figures, is not intended to limit the scope of the present disclosure, but is merely representative of certain implementations in various different scenarios. While various aspects are presented in the drawings, the drawings are not necessarily drawn to scale unless specifically indicated.

Wireless communication systems often require a highly stable and precise reference source for timing and frequency information. For example, simulcast communication systems transmit multiple identical RF signals from multiple transmit sites. Each of these signals are timed such that they simultaneously arrive in a coverage overlap region. This concept is illustrated in FIG. 1 which shows an overlap region 106 that exists with respect to transmit sites 102, 104 of a simulcast system 100. To facilitate the signal timing required in these types of systems, each of the transmit sites 102, 104 must have synchronized phase and frequency references. Other types of wireless communication systems (especially digital wireless communication systems) may also need a highly stable time and frequency reference. For example, such a reference source may be necessary to satisfy technical and/or regulatory requirements which specify signal performance characteristics. To facilitate these and other needs for a highly stable timing and frequency reference source, a communication system may use a GPS Disciplined Oscillator (GPSDO) to derive a highly accurate 1 pulse per second (1 PPS) timing signal and 10 MHz reference frequency signal.

Figure 2:
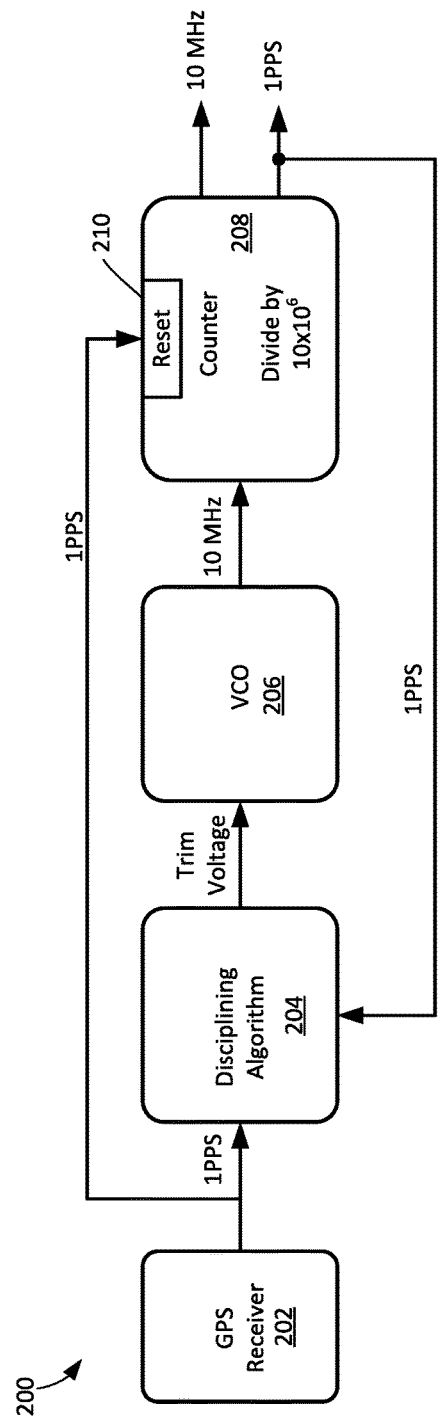
FIG. 2 is a block diagram that is useful for understanding a GPSDO.

A conventional GPSDO 200 shown in FIG. 2 can comprise a GPS receiver 202, a disciplining algorithm 204, a highly stable voltage controlled voltage controlled oscillator (VCO) 206, and a counter/divider 208. The GPS receiver 202 can provide a highly precise 1 PPS signal to facilitate timing and frequency reference signal needed, for example, in a simulcast communication system. In some scenarios, these timing and reference signals can include a 10 MHz reference frequency signal and a 1 PPS timing signal which are used for various purposes in the communication system. For example, the 10 MHz reference frequency signal and 1 PPS signal can be used for establishing an RF transmit frequency and/or to control a start of each batch of digital data samples which are to be transmitted.

There are occasions when a GPS satellite signal may, for various reasons, be temporarily unavailable to the GPS receiver 202. For this reason, a GPSDO 200 is designed to facilitate a holdover mode. In holdover mode, the GPSDO attempts to maintain accurate timing absent the GPS signal by using only its internal highly stable VCO 206. For example, in some scenarios a highly stable quartz or rubidium type VCO 206 may be used to minimize the phase drift of locally maintained frequency and timing reference signals relative to the temporarily unavailable GPS signal.

Still, it is inevitable during holdover that a certain amount of drift will occur. In particular, the VCO will drift with respect to frequency, thereby resulting in drift with respect to the phase and period of the 1 PPS timing reference signal. Consequently, a 1 PPS timing signal produced locally in reliance upon the VCO during a holdover period will assuredly begin to drift away from the phase and period of the 1 PPS signal specified by the GPS satellite. When the GPS satellite signal is reacquired by the GPS receiver 202, the GPSDO usually respond by asserting a reset 210. This action resets the locally generated 1 PPS GPSDO output signal to match the timing of the 1 PPS signal from the GPS receiver. This reset effectively synchronizes the 1 PPS signal of the GPSDO with the 1 PPS signal obtained from the GPS satellite, but this reset also causes a problem. The problem involves a loss of coherence as between the 1 PPS signal and the 10 MHz frequency reference signal. The loss of coherence results because when the reset occurs, there is at least one period during which there are not precisely 10×10⁶ cycles of 10 MHz per 1 PPS GPSDO output signal.

Certain other scenarios can also result in loss of coherence between the 10 MHz frequency reference and the 1 PPS timing reference. For example, coherence between the time and frequency reference signals can be lost in a timing arbitration scenario in which a failover occurs from a primary GPSDO to a redundant or backup GPSDO. Further, such loss of coherence can occur during a fail-over of a GPSDO to another type of timing reference, such as one which may rely upon a precision time protocol (PTP) used to synchronize clocks throughout a computer network. A well-known example of such a PTP is described in IEEE 1588, established by the Institute of Electrical and Electronics Engineers (IEEE), and entitled "Standard for a Precision Clock Synchronization Protocol for Networked Measurement and Control Systems".

The loss of coherence between a 1 PPS timing signal and a frequency reference can create problems in a modern digital communication system. For example, a conventional transmitter 102, 104 operating in accordance with a digital communication mode will in some scenarios transmit RF samples in lockstep with the 10 MHz frequency reference. Such a transmitter may also use the 1 PPS timing reference from the GPSDO as a timing reference. For example, the 1 PPS signal can be used to specify a time for beginning transmission of each successive batch of RF samples. In a simulcast scenario, this technique ensures that transmission of each batch of samples from a particular simulcast transmitter will begin at the same point in time as transmission from other simulcast transmitters. But if the timing and frequency references provided by the GPSDO fail to maintain coherence (i.e. exactly 10×10⁶ cycles of 10 MHz in 1 cycle of 1 PPS), then serious problems can occur. Data will need to be discarded or padded, FIFO buffers may over/under-run, and phase locked loops (PLLs) may lose lock. These issues can cause transmission errors and anomalies up to and including the occurrence of a dropped call.

Figure 3:
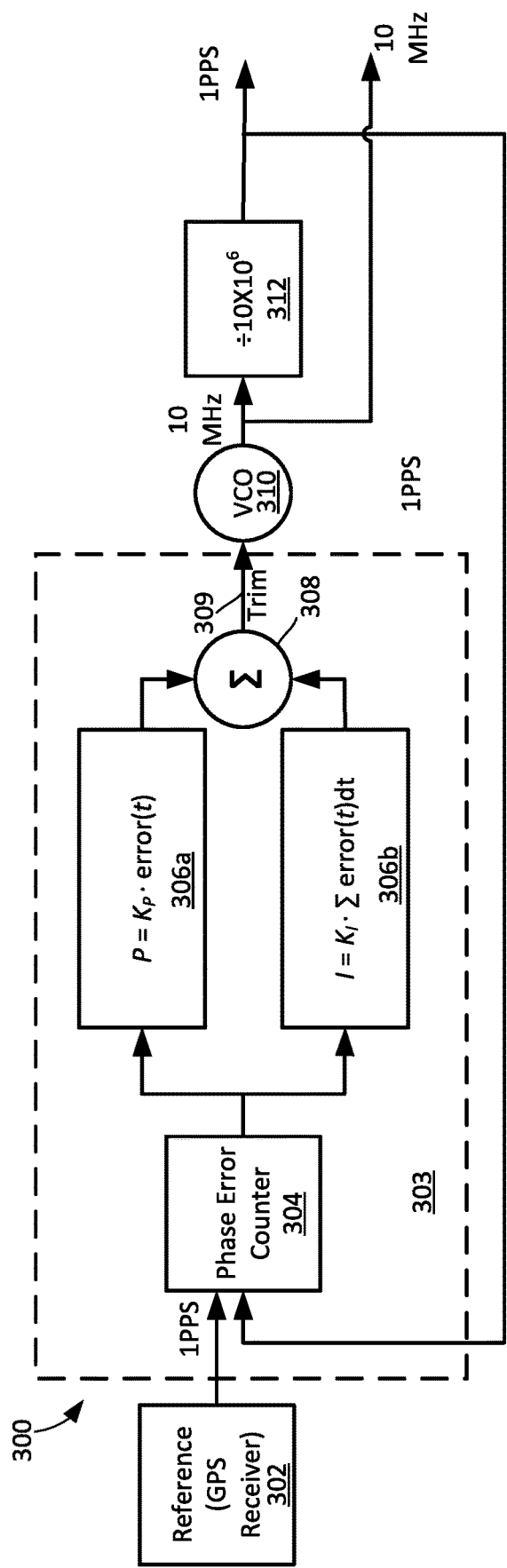
FIG. 3 is a block diagram that is useful for understanding a GPSDO which uses a proportional-integral (PI) loop to control an oscillator.

In a GPSDO 300 shown in FIG. 3 a disciplining algorithm is comprised of a proportional-integral (PI) loop. PI loops are well-known in the art and therefore will not be described here in detail. However, it is noted that a PI control loop is a special case of a conventional proportional-integral-derivative (PID) type of controller in which an error value is calculated as the difference between a desired set point and a measured variable. Based on this error term, the PID system will determine a correction to be applied to a given process based on a proportional (P), integral (I), and derivative (D) of the error term. A PI loop as described herein is similar to a PID loop except that the derivative (D) of the error term is not used.

A GPS receiver 302 provides a stable time reference (e.g., a 1 PPS signal) to the GPSDO 300. A PI control loop 303 is comprised of a phase error counter 304, a proportional error generator 306a, an integral error generator 306b, and an error summation unit 308. The phase error counter 304, proportional error generator 306a, integral error generator 306b, and error summation unit 308 can be comprised of one or more analog and/or digital electronic circuits which function cooperatively to facilitate operation of the PI loop. A VCO 310 functions as a stable frequency reference. The GPSDO 300 also includes a frequency divider 312 to facilitate a locally generated 1 PPS timing reference signal.

As used herein, the term digital electronic circuit is broadly intended to refer to any type of digital electronic circuit, including but not limited to a processing device, such as a microprocessor that is programmed to perform the functions described herein. Thus, the systems described herein can comprise one or more components such as a processor, an application specific circuit, a programmable logic device, a digital signal processor, or other circuit programmed to perform the functions described herein. The system can be realized in one computer system or several interconnected computer systems. Any kind of computer system or other apparatus adapted for carrying out the methods described herein is suited. In some scenarios, a combination of hardware and software can be a general-purpose computer system. The general-purpose computer system can have a computer program that can control the computer system such that it carries out the methods described herein.

In the PI control loop, phase error counter 304 determines a phase error by measuring a phase difference between a 1 PPS reference signal from the GPS receiver 302 and a locally generated 1 PPS signal output from frequency divider 312. Phase error counters are well-known and therefore will not be described here in detail. However, it will be appreciated that a conventional phase error counter 304 can include a phase detector (not shown). A conventional phase detector will generate an output pulse width that is equal to the phase difference between the rising edge of the 1 PPS timing pulse from the reference GPS receiver, and the rising edge of the 1 PPS pulse produced by the GPSDO 300. The phase error counter 304 will count the duration of the phase error pulse width to generate an error term error(t), which is then communicated to the proportional error generator 306a, and the integral error generator 306b. Depending on whether the particular implementation, the error(t) output can be comprised of discrete time-sampled digital data or a continuous analog signal.

The proportional error generator 306a, the integral error generator 306b and the error summation unit 308 can be implemented as part of one or more digital processing circuits. The proportional error generator 306a uses the error term error(t) from the phase error counter to calculate a proportional error term:

$$P = K_P \cdot \text{error}(t)$$

where $K_P$ is a coefficient of the proportional term. Similarly, integral error generator 306b calculates an integral error term $$I = K_I \Sigma \text{error}(t) dt$$

where error(t) is a time varying error term, and $K_I$ is a coefficient of the integral term. The VCO 310 is controlled with trim voltage 309 provided by the error summation unit 308. The trim voltage, when applied to the VCO, causes a small frequency offset to the VCO output. Such offset control or trimming of the VCO 310 is applied as needed so that the 1 PPS timing of the frequency divider 312 is aligned with the 1 PPS timing reference from GPS receiver 302.

The addition of the PI loop to the GPSDO shown in FIG. 3 can prevent a loss of coherence but introduces a further problem in the context of certain types of communication systems. The PI loop will, over a very brief duration of time, introduce a substantial phase correction to the locally generated 1 PPS output of the GPSDO 300. This rapid change in phase is effective at preventing loss of coherence between the locally generated 1 PPS signal and the output frequency of the VCO. But this phase correction to the 1 PPS signal necessarily requires a substantial and nearly instantaneous shift in the output frequency of the VCO 310.

The reference frequency output of the VCO 310 is commonly used as the basis for controlling a transmit frequency of a transmitter in a wireless communication transceiver. Regulatory bodies can and do establish strict limits on the variation of such transmit frequency over time. For example, these regulatory bodies may strictly specify the extent of frequency offset or deviation from a predefined transmit frequency that is permitted. So a sudden and substantial change in the output frequency of the VCO 310 can be a problem. To avoid this problem, the frequency offset introduced to the VCO by the PI loop can be limited in a way that ensures that a transmit frequency will always remain within limits set by one or more regulatory bodies. But at least in the context of a PI loop controller shown in FIG. 3, implementing a frequency offset limit for VCO 300 will cause control loop overshoot. Such overshoot will then substantially degrade the amount of time that is needed for convergence of the GPS satellite originated 1 PPS signal and the locally generated 1 PPS signal.

A solution to the frequency offset limit problem described herein with respect to GPSDO 300 avoids the problem of control loop overshoot and improves the time to convergence. This solution will now be described with respect to FIG. 4. The solution involves a timing and frequency reference system (TFRS) 400 which includes a GPSDO with a VCO. As explained below in further detail, the arrangement ensures that coherence can be maintained between a 10 MHz frequency reference signal and a timing reference output (e.g., a 1 PPS signal) output when a step change in the reference input timing signal occurs.

The TFRS 400 is comprised of a PI loop 409. PI loop 409 can be comprised of an analog and/or digital electronic circuitry which functions in a manner that is similar to the PI loop 303 described with respect to FIG. 3. As such, the PI loop 409 will include a phase error counter 410, a proportional error generator 412*b*, integral error generator 412*a*, and an error summation unit 414. The TFRS 400 also includes a VCO 420, and a frequency divider 422. The VCO 420 and the divider 422 shown in FIG. 4 function in a way that is similar to the VCO 310 and the divider 312 in FIG. 3. The TFRS 400 also includes a frequency offset limiter 416. The function and purpose of the frequency offset limiter 416 will be described below.

A reference validation and selection circuit (RVSC) 408 is also comprised of a multiplexer 424 which can facilitate timing signal selection from among two or more timing reference inputs such as GPS receiver 402, backup timing reference 404, and high stability oscillator 406. More particularly, the multiplexer 424 can be controlled to select a particular timing reference signal which is to be used as a timing reference output to be communicated to the phase error counter 410. The RVSC 408 also includes a timing validation unit (TVU) 426. The TVU 426 is a digital or analog circuit which is configured to determine when a particular timing reference signal (e.g., a primary timing reference signal from the GPS receiver 402) is absent and/or is in a fault condition. The TVU is configured to control the multiplexer 424 in response to such determination so as to select a different input timing reference signal to be communicated to the phase error counter 410. The RVSC 408 can monitor a timing reference signal from one or more of the timing references 402, 404, 406 to facilitate such determination.

When a timing reference signal (e.g., a 1 PPS signal) is available from the primary timing reference source (e.g., from GPS receiver 402), the RVSC 408 will communicate such primary timing reference signal to the phase error counter 410 in the PI loop 409. But when the RVSC 408 determines that the timing reference signal from the primary timing reference source is unavailable or otherwise in a fault condition, the RVSC can automatically select a backup timing reference source. The backup timing reference source can be any of one or more suitable backup timing references such as backup timing reference 404 or high stability oscillator 406. The selected backup timing reference is then used as a source of a timing reference signal to be communicated to the PI loop 409.

Figure 4:
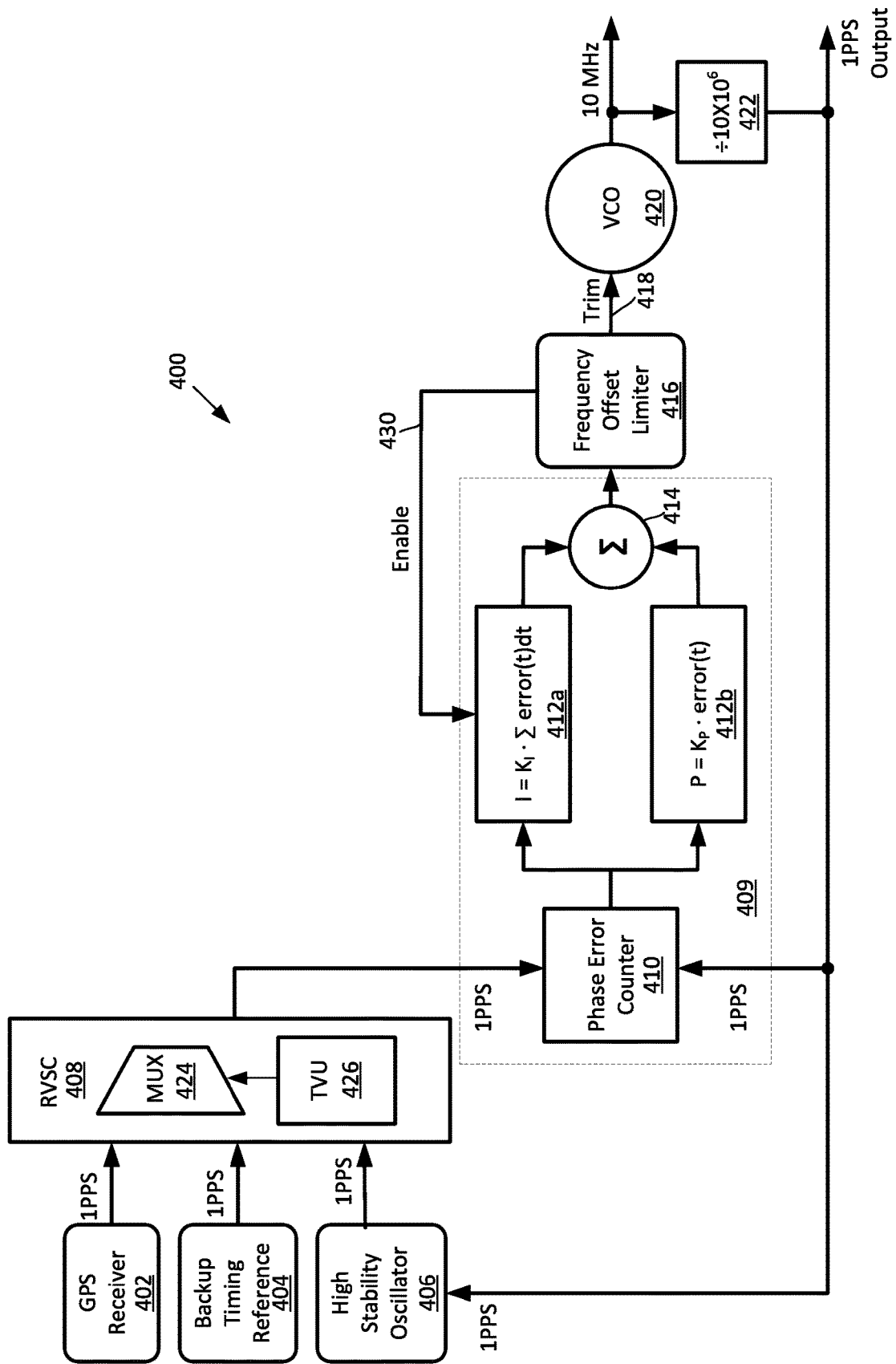
FIG. 4 is a block diagram which is useful for understanding a timing and frequency reference system (TFRS) which limits frequency overshoot and maintains coherence between a timing reference signal and a frequency reference signal.

In some scenarios, the backup timing reference 404 can be a PTP type of reference based on a suitable standard such as IEEE 1588. However, other suitable backup timing reference sources can also be used provided that timing precision and accuracy requirements are satisfied. Also it should be noted that FIG. 4 shows only two backup timing reference sources, namely backup reference 404 and high stability oscillator 406. But the solution is not limited in this regard and one or more additional backup timing references can be provided.

As explained below in further detail, the PI loop 409 is configured to synchronize the VCO 420 to the primary timing reference signal or to the one or more backup timing reference signals. In the example shown, the timing reference signal provided from GPS receiver 402 and backup timing reference 404 can be a 1 PPS signal. However, it should be understood that the solution is not limited in this regard and other timing reference signals are also possible. It is common in many systems to select 10 MHz as a frequency reference and 1 PPS as a timing reference. However, the methods and systems described herein are applicable to any frequency reference/timing reference pairs that are proportionally related.

Turning now to FIG. 5, there is shown a process flow which is useful for understanding certain aspects of the solution presented herein. The process has certain advantages insofar as it can limit frequency overshoot during timing recovery operations, while still facilitating rapid convergence.

The process begins at 502 and continues to 504 where a timing reference source signal is selected. This selection can be performed by the RVSC 408. For example, if a 1 PPS timing reference signal is available from the GPS receiver 402, and is not in a fault condition, then the RVSC 408 can select the 1 PPS timing signal from the GPS receiver 402. This timing signal can then be communicated through the RVSC 408 to the PI loop 409. In the event that the timing reference signal from the GPS receiver 402 is unavailable or experiencing a fault condition, then the RVSC 408 can instead select a backup timing reference source, such as backup timing reference 404 or high stability oscillator 406. If the timing reference signal from the GPS receiver 402 once again becomes stable and available, the RVSC 408 can select the GPS receiver 402 as the timing reference signal source.

Figure 5A:
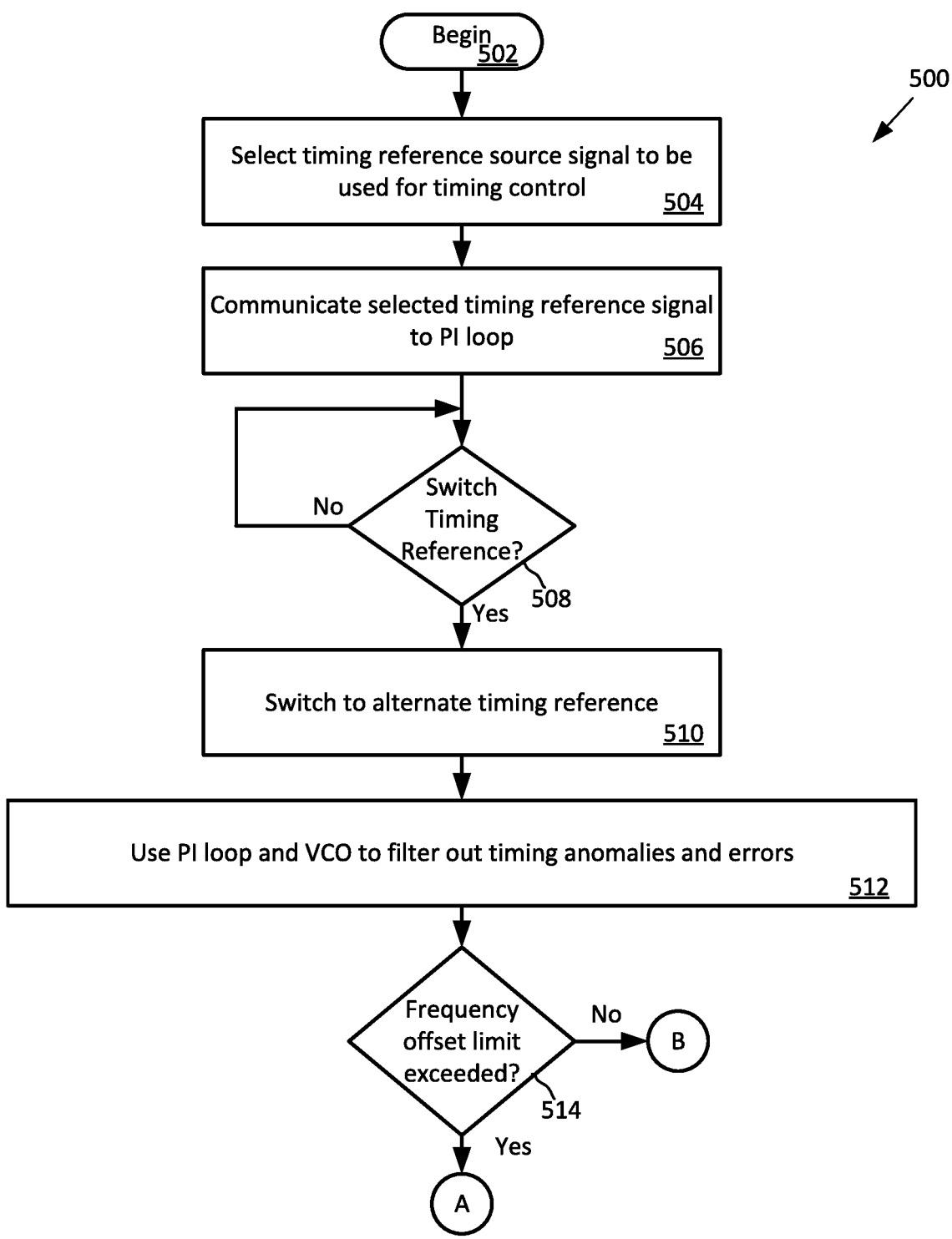
FIGS. 5A and 5B (collectively referred to herein as FIG. 5) are a series of flow diagrams that are useful for understanding a process in a TFRS for limiting frequency overshoot and maintaining coherence between a timing reference signal and a frequency reference signal.
Figure 5B:
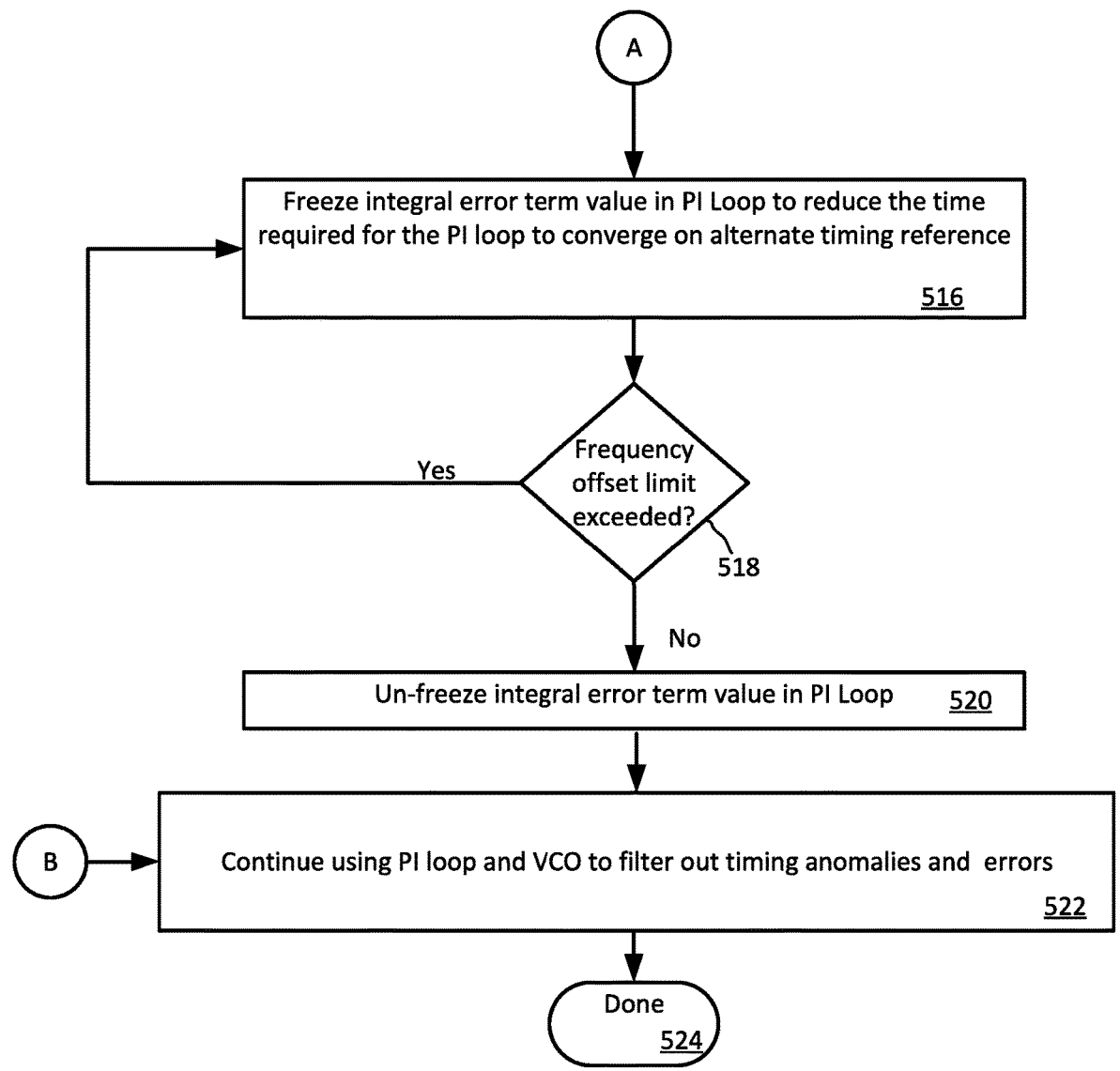

For convenience in describing the process in FIG. 5A-5B, it can be assumed that the GPS receiver 402 is the primary timing reference source and that the backup timing reference 404 or high stability oscillator 406 is utilized when the timing reference signal from the GPS receiver is unavailable or in a fault condition. The advantages of GPS timing references are well-known and it can therefore be the most advantageous choice for use as a primary timing reference. Still, it should be understood that the solution described herein is not limited to scenarios in which the GPS receiver is the primary timing reference. There may be some scenarios in which the GPS receiver could serve as a backup timing reference and some other timing reference source could serve as a primary timing reference.

The process continues at 506 in which the selected timing reference signal is communicated from the RVSC 408 to the PI loop. At 508, the RVSC continues to monitor the condition of one or more of the timing reference signals to determine whether a different timing reference source should be selected. A decision to switch timing references can result occur under various conditions. In one scenario, a selected timing reference signal (such as a primary timing reference signal) may not be available or is exhibiting improper characteristics. When either of these conditions exist, the timing reference signal can be said to be experiencing a fault condition. Consequently, a decision will be made to switch to a different timing reference (508: Yes).

A fault condition in a 1 PPS timing reference can involve any scenario in which the 1 PPS signal is exhibiting less than ideal behavior. For example, the signal may be absent, intermittent, distorted or may exhibiting excess jitter. If the timing reference source is the GPS receiver, then the foregoing can be an indication that there is some problem with the GPS signal, the GPS receiver, the communication link between the GPS receiver and the GPS satellite, or an interface. Accordingly, in such instance the RVSC 408 will select an alternate timing reference (e.g., backup timing reference 404 or high stability oscillator 406) to be used as the source of a timing reference signal, as shown by 510. In other scenarios a decision to switch timing reference at 508 may be based on a determination that a previously unavailable or faulty timing reference (e.g., GPS receiver 402) has once again become available, and/or is no longer experiencing a fault condition.

There will usually be a slight timing variation as between the signal from the timing reference source that is currently in use and the alternate timing reference source which is not currently in use. Accordingly, when a transition occurs from the first timing reference source to the second timing reference source, there will usually be a step timing change in the timing reference signal that is communicated to the PI loop. This step timing change represents the timing difference between the first timing reference source and the second timing reference source. Most often this step timing change will occur when reverting to a primary reference source such as GPS receiver 402 after a holdover period. This sudden variation or change in the timing reference signal can result in a lack of coherence as between the timing reference signal (e.g., a 1 PPS signal) and a frequency reference signal (e.g., a 10 MHz frequency reference signal) produced by TFRS 400.

The process continues at 512 where the PI loop and VCO are used as described above to filter out timing anomalies and errors. When a step timing change does occur from use of an alternate timing source, this change will manifest itself as a phase error at phase counter 410. The phase error will in turn cause a proportional error generator 412b and integral error generator 412a to output proportional and integral error values to the error summation unit 414. The resulting error signal output from the summation unit 414 will be communicated to the VCO 420 as a trim voltage 418, which is then used to adjust the output frequency of the VCO. As noted, the goal of this frequency adjustment is to maintain coherence between the time reference signal (e.g., the 1 PPS signal) and the frequency reference signal (e.g., the 10 MHz signal) that are output from the TFRS 400.

In some instances, when a transition occurs from a first timing reference source to a second timing reference source, the error signal output from the error summation unit 414 will cause an output frequency of the VCO to exceed a predetermined frequency offset limit $\Delta f$. Accordingly, a determination can be made at 514 as to whether a predetermined frequency offset limit value $\Delta f$ has been exceeded. This condition occurs when a frequency offset specified by an output of summation unit 414 will cause the VCO to exceed the predetermined frequency offset limit $\Delta f$. In the solution shown in FIG. 4, a determination that a frequency offset limit value has been exceeded can be made in a frequency offset limiter 416. In some scenarios, the frequency offset limiter 416 can be a voltage comparator that is configured to detect this condition and respond to it by controlling an enable signal 430.

Referring once again to FIGS. 5A and 5B, if the frequency offset limit has not been exceeded (514: No), the enable signal 430 can be controlled so that the process will continue on to step 522. In step 522, the operation of the PI loop continues in a conventional manner. However, if the frequency offset limit has been exceeded (514: Yes), the process continues on to 516 where an integral error term value in the PI loop is frozen or locked. In this state, the integral error term will be maintained at a constant value. For example, the value can be locked to the output value that was produced when it was first determined that the frequency offset limit was exceeded.

In the example architecture shown in FIG. 4, this freezing or locking operation can be facilitated by controlling the enable signal 430. The enable signal control freezes or locks the output of the integral error generator 412a. Under such condition, the PI loop 409 will continue to operate, but its function will be advantageously modified in a temporary way. This modification to the operation of the PI loop will control the VCO 420 in a way that rapidly converges the locally generated 1 PPS output of TFRS 400 with the 1 PPS timing reference signal (e.g., 1 PPS from the GPS receiver 402) and with minimal overshoot, while preventing unacceptable variations in the frequency reference output signal. Coherence is maintained between the frequency reference and 1 PPS output of the TFRS 400, while achieving more rapid timing convergence as compared to that which would be needed if the integral error generator in the PI loop was not frozen.

At 518, the process continues by determining whether the frequency offset limit continues to be exceeded. If so (518: Yes), the output of the integral error generator 412 can remain frozen or locked as described herein. However, if the frequency offset limit is no longer exceeded (518: No), then the integral error term can be unlocked at 520. In some scenarios, this can be accomplished by using the frequency offset limiter 416 to once again control the enable signal 430. The process then continues on to 522 where the PI loop and VCO function cooperatively to filter out timing anomalies and errors. For example, the PI loop can continue to add a frequency offset to the output frequency of the VCO until such time as the timing output (1 PPS signal) of system 400 is aligned with the 1 PPS timing of the selected timing reference source. At 524, the process can terminate or additional processing can be performed.

The described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A method for limiting frequency overshoot in a timing recovery loop, comprising:
   using a proportional-integral (PI) control system to discipline a frequency of an output signal of a voltage controlled oscillator (VCO) in accordance with a time reference signal;
   detecting a control signal output of the PI control system which will cause a predetermined limit to be exceeded by an excess deviation, the excess deviation comprises a deviation of the frequency from a set frequency;
   in response to the detecting, locking an output of an integral error term generator of the PI control system.

2. The method of claim 1, further comprising unlocking the output of the integral error term generator of the PI control system when the excess deviation is no longer detected.

3. The method of claim 1, wherein the output signal of the VCO is a frequency reference signal, and the method further comprises using the PI loop to maintain coherence as between the time reference signal and the frequency reference signal.

4. The method of claim 1, wherein the time reference signal is provided by at least one time reference source, and the excess deviation is caused by transitioning from a first time reference source to a second time reference source that is different from the first time reference source.

5. The method of claim 4, wherein the first time reference source is a backup time reference source, and the second time reference source is a GPS receiver that serves as a primary time reference source.

6. The method of claim 5, further comprising using the backup time reference source during a holdover mode when the GPS receiver is in a fault condition.

7. The method of claim 4, further comprising facilitating the transitioning by
   monitoring an output of at least one of the first time reference source and the second time reference source; and
   selecting a preferred time reference source as between the first and second time reference source based on one or more criteria associated with the monitoring.

8. The method of claim 7, wherein the one or more criteria are selected from a group consisting of functional availability, measured signal performance, and known quality characteristics, of one or more of the first and second time reference sources.

9. The method of claim 8, wherein the time reference source is selected from a group consisting of a GPS receiver and a backup time reference source.

10. The method of claim 9, wherein the backup time reference source is selected from a group consisting of a high stability oscillator and a computer network precision time protocol (PTP).

11. A timing and frequency reference system (TFRS) which minimizes frequency overshoot during timing recovery, comprising:
    a voltage controlled oscillator (VCO);
    a proportional-integral (PI) control system generating a control signal, the PI control system configured to discipline a frequency of an output signal of the VCO in accordance with a time reference signal;
    a frequency offset limiter responsive to the control signal and configured to lock an output of an integral error term generator of the PI control system responsive to detecting a condition of the control signal that will result in a predetermined limit being exceeded by an excess deviation the excess deviation comprises a deviation of the frequency from a set frequency.

12. The TFRS of claim 11, wherein the frequency offset limiter is configured to unlock the output of the integral error term generator of the PI control system when the excess deviation is no longer detected.

13. The TFRS of claim 11, wherein the output signal of the VCO is a frequency reference signal, and the PI control system is configured to maintain coherence as between the time reference signal and the frequency reference signal.

14. The TFRS of claim 11, further comprising a reference validation and selection circuit (RVSC) configured to select one time reference source from among a plurality of time reference sources for providing the time reference signal, and wherein the excess deviation is caused by transitioning from a first time reference source to a second time reference source that is different from the first time reference source.

15. The TFRS of claim 14, wherein the first time reference source is a backup time reference source, and the second time reference source is a GPS receiver that serves as a primary time reference source.

16. The TFRS of claim 15, wherein the RVSC is configured to select the backup time reference source during a holdover mode when the GPS receiver is in a fault condition.

17. The TFRS of claim 14, wherein the RVSC is configured to monitor an output of at least one of the first time reference source and the second time reference source and select a preferred time reference source as between the first and second time reference source based on one or more criteria associated with the monitoring.

18. The TFRS of claim 17, wherein the one or more criteria are selected from a group consisting of functional availability, measured signal performance, and known quality characteristics, of one or more of the first and second time reference sources.

19. The TFRS of claim 18, wherein the time reference source is selected from a group consisting of a GPS receiver and at least one backup time reference source.

20. The TFRS of claim 19, wherein the at least one backup time reference source is selected from a group consisting of a high stability oscillator and a computer network precision time protocol (PTP).

* * * * *